United States Patent
Mizojiri et al.

(10) Patent No.: US 11,398,394 B2
(45) Date of Patent: Jul. 26, 2022

(54) HEATING TREATMENT METHOD AND OPTICAL HEATING DEVICE

(71) Applicant: Ushio Denki Kabushiki Kaisha, Tokyo (JP)

(72) Inventors: Takafumi Mizojiri, Tokyo (JP); Yukio Ueshima, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/432,919

(22) PCT Filed: Feb. 12, 2020

(86) PCT No.: PCT/JP2020/005268
§ 371 (c)(1),
(2) Date: Aug. 21, 2021

(87) PCT Pub. No.: WO2020/195265
PCT Pub. Date: Oct. 1, 2020

(65) Prior Publication Data
US 2022/0148895 A1    May 12, 2022

(30) Foreign Application Priority Data
Mar. 27, 2019   (JP) .............................. JP2019-060462

(51) Int. Cl.
*H01L 21/67*   (2006.01)
*H05B 3/00*    (2006.01)
*H01L 21/66*   (2006.01)
*H01L 21/268*  (2006.01)
*H05B 1/02*    (2006.01)

(52) U.S. Cl.
CPC .... *H01L 21/67115* (2013.01); *H01L 21/2686* (2013.01); *H01L 21/67248* (2013.01); *H01L 22/20* (2013.01); *H05B 1/0233* (2013.01); *H05B 3/0047* (2013.01)

(58) Field of Classification Search
CPC .............. H01L 21/67248; H01L 22/20; H01L 21/67098–67115; H01L 21/26–2686; H05B 1/0233; H05B 3/0047
See application file for complete search history.

(56) References Cited

U.S. PATENT DOCUMENTS 6,818,864 B2   11/2004  Ptak
8,041,197 B2   10/2011  Kasai et al.
(Continued)

FOREIGN PATENT DOCUMENTS

JP   2005-536045 A   11/2005
JP   2007-141896 A   6/2007
(Continued)

*Primary Examiner* — Selim U Ahmed
*Assistant Examiner* — Evan G Clinton
(74) *Attorney, Agent, or Firm* — Kenichiro Yoshida

(57) ABSTRACT

A heating treatment method includes:
a step (A) of supplying power to both a heating lamp and an LED, and irradiating a heating object with light emitted from the heating lamp and light emitted from the LED to raise the temperature of the heating object;
a step (B) of decreasing the power supplied to the heating lamp after performing the step (A); and
a step (C) of lowering the temperature of the heating object by decreasing the power supplied to the LED after performing the step (B).

16 Claims, 9 Drawing Sheets

(56) References Cited

U.S. PATENT DOCUMENTS

| | | |
|---|---|---|
| 8,315,510 B2 | 11/2012 | Ueshima et al. |
| 2009/0034948 A1* | 2/2009 | Ueshima .......... H01L 21/67115 |
| | | 392/416 |
| 2011/0073589 A1 | 3/2011 | Shimizu |
| 2011/0291022 A1* | 12/2011 | Lee ................. H01L 21/67248 |
| | | 250/492.2 |
| 2013/0132705 A1 | 5/2013 | Ishii |
| 2016/0379854 A1 | 12/2016 | Vopat et al. |
| 2018/0047596 A1 | 2/2018 | Si et al. |

FOREIGN PATENT DOCUMENTS

| | | |
|---|---|---|
| JP | 2008-60560 A | 3/2008 |
| JP | 2009-27001 A | 2/2009 |
| JP | 2011-77065 A | 4/2011 |
| JP | 2012-524400 A | 10/2012 |
| JP | 2014-502012 A | 1/2014 |
| WO | 2012/064371 A1 | 5/2012 |

* cited by examiner

HEATING TREATMENT METHOD AND OPTICAL HEATING DEVICE

TECHNICAL FIELD

The present invention relates to heating treatment methods and optical heating devices, and more particularly a heating treatment method and an optical heating device using two different light sources.

BACKGROUND ART

Conventionally, optical heating devices using heating lamps have been mainly used for the heating treatment of silicon wafers. In recent years, heating devices using LEDs as a light source have been considered because the LEDs save power and can select a light spectrum suitable for heating compared with the heating lamps.

For example, the following Patent Document 1 discloses a configuration of an optical heating device using a light source that combines a halogen lamp with an LED emitting light having a wavelength that exhibits a high absorptance for silicon wafers.

CITATION LIST

Patent Document

Patent Document 1: JP-T-2014-502012

SUMMARY OF INVENTION

Technical Problem

In the recent semiconductor manufacturing industry, several hundreds of thousands to several millions of silicon wafers are manufactured annually at a single manufacturing site. There is a market demand on manufacturing devices and treating devices that shorten a tact time of processing each wafer by even one second. Moreover, in the heating treatment process including deposition process and etching process of silicon wafers (hereinafter referred to as "heating object" including other heating objects), maintaining a high temperature state longer than the time required for the heat treatment may cause unintended chemical reactions in the heating object. Hence, an optical heating device that can rapidly lower the temperature is expected.

However, optical heating devices using heating lamps such as halogen lamps have a slow response characteristic (hereinafter referred to simply as "responsiveness"), the responsiveness being indicated as variation in the intensity of emitting light in response to variation in the supplied power. Furthermore, the optical heating device has a limit to speed up the responsiveness due to the large heat capacity of the glass and filaments that constitute the heating lamps, thus making it difficult to speed up the temperature rise and fall.

The present inventors have examined the shortening of the time required to raise and lower the temperature of heating objects using LEDs, which have faster responsiveness than heating lamps and are not composed of glass or filaments; then they found the following problems existed. Hereinafter, the problems are described with reference to drawings.

First, the differences in responsiveness between halogen lamps and LEDs as examples of heating lamps will be explained. FIG. 10A illustrates the variation of amount of light emitted from halogen lamps and LEDs at the start of supplying the power (temperature rise time). FIG. 10B illustrates the variation of amount of light emitted from the halogen lamps and the LEDs at the stop of supplying the power from the lighting state (the temperature fall time).

As shown in FIG. 10A, the halogen lamps take approximately 0.5 second to reach 90% of its maximum output after starting supplying the power; whereas the LEDs take approximately 0.02 second to reach its maximum output. As shown in FIG. 10B, the halogen lamps take approximately 0.4 second to decrease from its maximum output to 10% thereof after stopping the power; whereas the LEDs take approximately 0.01 second to decrease from its maximum output to nearly 0% thereof after stopping supplying the power.

As can be seen from the above, LEDs have faster responsiveness than halogen lamps, thus using LEDs as a light source for heating in the optical heating system is very effective in shortening the time required for the treatment process.

However, LEDs have a limited amount of power supplied thereto, because the excessive power can turn them off or damage them due to their self-heating. Hence, an optical heating device composed only of LEDs cannot emit light with the same energy as the light emitted from an optical heating device composed of halogen lamps. The optical heating system composed only of LEDs, for example, in the deposition treatment process of silicon wafers or the like, can only raise the temperature of silicon wafers to around 400 to 500° C. although the temperature of silicon needs to be raised around 800° C.

Hence, as shown in Patent Document 1, LEDs are considered to be combined with heating lamps including halogen lamps, in order to raise the temperature of the heating object to a high temperature while taking advantage of the fast responsiveness of LEDs.

However, simply combining heating lamps with LEDs does not lead to shortening the temperature rise and fall time. In particular, since the temperature fall time is affected by the slow responsiveness of halogen lamps, thus, in order to shorten the temperature fall time, each light source needs to be controlled appropriately to lower the temperature rapidly due to the responsiveness of LEDs without being influenced by halogen lamps.

In view of the above problem, it is an object of the present invention to provide a heating treatment method and an optical heating device that is capable of rapidly raising and lowering the temperature of the heating objects using a light source that combines heating lamps with LEDs.

Solution to Problem

A heating treatment method of the present invention includes:

a step (A) of supplying power to both a heating lamp and an LED, and irradiating a heating object with light emitted from the heating lamp and light emitted from the LED to raise the temperature of the heating object;

a step (B) of decreasing the power supplied to the heating lamp after performing the step (A); and a step (C) of lowering the temperature of the heating object by decreasing the power supplied to the LED after performing the step (B).

The step (A) of raising the temperature of the heating object involves supplying power to both the heating lamp and the LED and irradiating the heating object with light emitted from both the light sources, thus raising the temperature of the heating object to a predetermined temperature. Immediately after starting the temperature rise, the light emitted from the LED rapidly raises the temperature of the heating object due to the rapid responsiveness of the LED. When the output of the heating lamp gradually increases, the light emitted from the heating lamp further raise the temperature of the heating object from the temperature raised by the LED, eventually raising the temperature thereof to nearly a target temperature by the light emitted from both the heating lamp and the LED.

In the method described above, the light emitted from both the heating lamp and the LED raises the temperature of the heating object, with accelerating the temperature rise due to the fast responsiveness of the LED immediately after the start of the temperature rise, thus shortening the temperature rise time to reach the target temperature.

After the temperature reaches the predetermined temperature, or after the time expected to reach the predetermined temperature elapses by the step (A), the step (B) is performed to decrease the power supplied to the heating lamp to decrease the intensity of light emitted from the heating lamp.

After performing the step (B), the step (C) decreases the power supplied to the LED, which decreases the intensity of the light emitted from the LED, thus lowering the temperature of the heating object. In this method, the output of the heating lamp has already been decreased by the time of lowering the temperature of the heating object. Hence, the temperature of the heating object is lowered by the LED, which has fast responsiveness, without being affected by the heating lamp, which has slow responsiveness, thus leading to shortening the temperature fall time.

In the step (B), "decreasing the power supplied to the heating lamp" may be a method of controlling to decrease the power supplied to the heating lamp, a method of stopping the power, or a method of shutting off the supply route by a switch. The similar is applied to "decreasing the power supplied to the LED" in the step (C).

In the heating treatment method described above, the step (B) may be a step of maintaining the temperature of the heating object within a predetermined temperature range.

In the heating treatment method described above, the step (B) may include a step of maintaining the power supplied to the LED, the step (B) being from a predetermined time to before the start of the step (C).

In the process of heating treatment of a heating object, such as the deposition treatment of the heating object (silicon wafer), the heating object needs to be heated and maintained at a predetermined period in a temperature range, for example, approximately 600° C. or higher or 800° C. or higher to allow the deposition treatment to proceed. In this case, the energy needs to be continuously supplied to the heating object to avoid lowering the temperature thereof.

However, in the case of maintaining the temperature of the heating object, unlike the case of raising the temperature, the temperature of the heating object can be maintained by irradiating with light having the energy equivalent to the thermal energy released from the heating object. Hence, this case does not require the same amount of energy needed to raise the temperature thereof. For example, as the method described above, the temperature of the heating object is capable of being maintained by including a step of maintaining the power supplied to the LED in a period from a predetermined time to before the start of the step (C).

Since the light irradiated to the heating object only requires the energy equivalent to the thermal energy released therefrom, the power supplied to the LED may not maintain the power equivalent to the power supplied in the step (A).

In the heating treatment method, the step (A) may include a period in which the intensity of light emitted from the LED is higher than that of light emitted from the heating lamp, the step (A) being from the start of the temperature rise to a predetermined time.

Since the step (A) includes the period in which the intensity of light emitted from the LED being higher than that of light emitted from the heating lamp, from the start of the temperature rise, the temperature of the heating object is rapidly raised by the light emitted from the LED at the start of the temperature rise, thus shortening the temperature rise time to reach the target temperature.

An optical heating device of the present invention for heating a heating object, the optical heating device includes:

a heating lamp;
an LED;
a control unit for controlling power supplied to the heating lamp and the LED; and
a supporter for supporting the heating object;
wherein the control unit performs a first control that controls the power supplied to both the heating lamp and the LED, a second control that decreases the power supplied to the heating lamp after performing the first control, and a third control that decreases the power supplied to the LED after performing the second control.

The optical heating device of the present invention is configured to heat the heating object that is supported by the supporter by irradiating with light emitted from the heating lamp and the LED, and includes the control unit for controlling the power supplied to the heating lamp and the LED to raise and lower the temperature of the heating object.

The control unit performs the first control to supply the power to both the heating lamp and the LED, then light emitted from each light source is irradiated onto the heating object to raise the temperature thereof. After the temperature reaches a predetermined temperature or the time expected to reach the predetermined temperature elapses by performing the first control in which the heating object is irradiated with light from each light source, the control unit performs the second control in which the power supplied to the heating lamp is decreased. After performing the second control, the control unit performs the third control in which the power supplied to the LED is decreased to decrease the intensity of light emitted from the LED, thus lowering the temperature of the heating object.

When the control unit performs the first control, light emitted from the LED rapidly raises the temperature of the heating object just after the start of temperature rise due to the fast responsiveness of the LED. When the output of the heating lamp gradually increases, light emitted from the heating lamp further increases the temperature thereof from the temperature raised by the LED, eventually raising the temperature thereof to nearly the target temperature by the light emitted from both of the heating lamp and the LED.

The above configuration allows the light emitted from both the heating lamp and the LED to raise the temperature of the heating object, speeding up the temperature rise just after the start of the temperature rise due to the fast responsiveness of LED, thus shortening the temperature rise time.

In the case of lowering the temperature, the control unit controls to decrease the power supplied to the LED, which decreases the intensity of light emitted from the LED, to lower the temperature of the heating object. At this time, the second control unit has already decreased the power supplied to the heating lamp, which decreases the intensity of light emitted from the heating lamp; hence the temperature of the heating object is lowered due to the fast responsiveness of LED, without being affected by the slow responsiveness of the heating lamp, therefore shortening the temperature fall time.

The term "decrease the power supplied to the heating lamp" may be a control of decreasing the power supplied to the heating lamp, a control of stopping the power, or a control of shutting off the supply route by a switch. The similar control may be applied to "decrease the power supplied to the LED".

In the optical heating device described above, the control unit may control to maintain the power supplied to the LED in the second control, the second control being from a predetermined time to before the start of the third control.

In the case of performing the heating treatment of the heating object described above, the temperature of the heating object needs to be maintained within a predetermined range to proceed the treatment until completing the treatment including the deposition treatment of the heating object. Hence, after the temperature of the heating object has been raised to the predetermined temperature, the control unit controls to maintain the power supplied to the LED such that the temperature of the heating object is maintained in a required period, in other words, the energy of light emitted from the LED is equivalent to the energy released from the heating object. It is noted that the LED is capable of readily fine-tuning the light intensity by the control of the control unit, thus allowing the control unit to easily maintain the temperature of the heating object with high accuracy.

In the optical heating device described above, the control unit may control to include a period in which the intensity of light emitted from the LED is higher than that of light emitted from the heating lamp in the first control, the first control being from the start of the temperature rise to a predetermined time.

Since the control unit control to include the period in which light emitted from the LED has a higher intensity than light emitted from the heating lamp, at the start of the temperature rise, the temperature of the heating object is rapidly raised by the LED, which has fast responsiveness, at the start of the temperature rise, thus further shortening the temperature rise time.

For allowing the control unit to include the period in which light emitted from the LED has a higher intensity than light emitted from the heating lamp, at the start of the temperature rise, the control unit may control to supply the power to only the LED for heating at the start of the temperature rise, and may control to nearly simultaneously supply the power to both the LED and the heating lamp for heating.

The optical heating device may include a thermometer for measuring the temperature of the heating object, and the control unit may switch from the first control to the second control by detecting that the temperature of the heating object reaches a predetermined temperature, the temperature of the heating object being measured with the thermometer.

The above configuration allows the control unit to switch from the first control to the second control in response to the temperature of the heating object reaching the predetermined temperature; thereby optimizing the timing of the switch from the first control to the second control, leading to suppressing the unnecessary temperature rise and power consumption.

Examples of the thermometer for measuring the temperature of the heating object include thermocouples and radiation thermometers.

Advantageous Effects of Invention

The present invention provides a heating treatment method and an optical heating device that is capable of rapidly raising and lowering the temperature of the heating object using a light source that combines a heating lamp with an LED.

DESCRIPTION OF EMBODIMENTS

Hereinafter, embodiments of a heating treatment method and an optical heating device in accordance with the present invention will now be described with reference to the drawings. It is noted that the each of the following drawings is merely schematically illustrated. The dimensional ratios and the number of parts on the drawings do not necessarily match the actual dimensional ratios and the actual number of parts.

First Embodiment

Figure 1A:
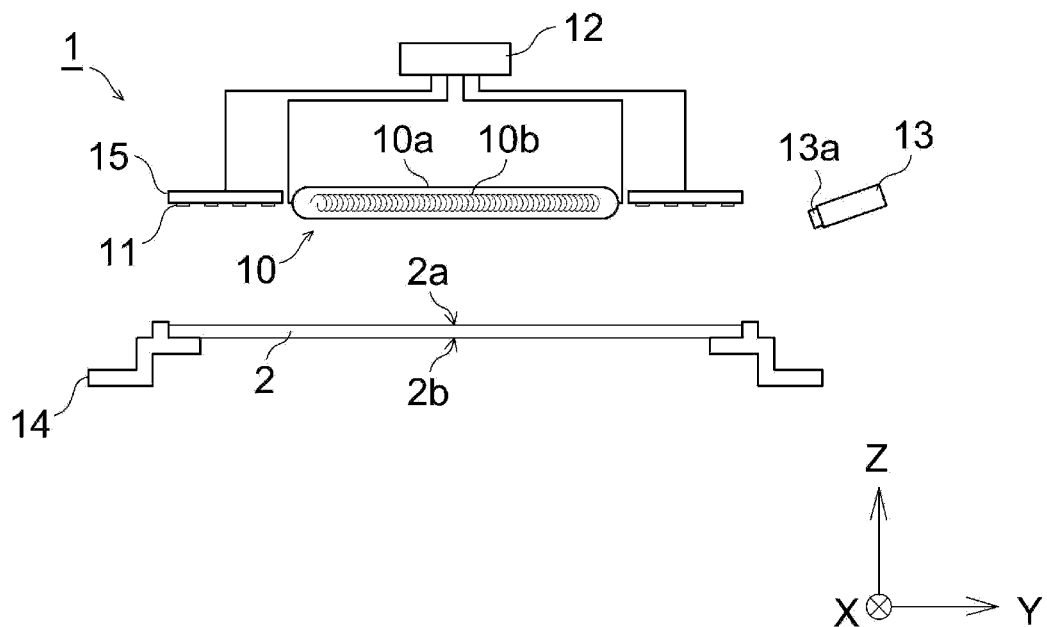
FIG. 1A is a schematic cross-sectional view illustrating a first embodiment of an optical heating device.

FIG. 1A is a schematic cross-sectional view illustrating a first embodiment of an optical heating device 1. As shown in FIG. 1A, the optical heating device 1 of the first embodiment is provided with heating lamps 10, LEDs 11, a control unit 12 that controls power, a thermometer 13 that measures the temperature of the heating object 2, and a supporter 14 that supports the heating object 2.

Here, in the following explanation, the plane parallel to a first irradiation surface 2a of the heating object 2 is defined as the XY plane. The direction orthogonal to the first irradiation surface 2a of the heating object 2 is defined as the Z direction. The opposite surface of the first irradiation surface 2a of the heating object 2 is a second irradiation surface 2b.

The heating lamp 10 has a straight tubular shape with a filament 10b inside a tube body 10a extending in one direction. The heating lamp 10 may have a light bulb shape.

The heating lamps 10 can be, for example, halogen lamps, carbon heaters, Kanthal heaters, ceramic heaters, or any other lamps that emit infrared light having a wavelength band that matches the absorption wavelength band of the heating object 2. The LEDs 11 can be selected to emit light having a wavelength band in which the absorptance of the heating object 2 is high. The heating lamp 10, although not shown in detail in FIG. 1A, is provided with a conductive member and a sealing part that hermetically seals the light-emitting tube (glass tube) at each of both ends thereof. The heating lamp 10 is configured to be removed in a direction perpendicular to the Z direction.

The control unit 12 controls power supplied to the heating lamps 10 and the LEDs 11. The position of the control unit 12 shown in FIG. 1 is schematically shown, and can be anywhere in practice.

The thermometer 13 is a radiation thermometer in the first embodiment, and is disposed such that the light-receiving part 13a faces the first irradiation surface 2a of the heating object 2 at a direction inclined from the Z direction. The position of the thermometer 13 is merely an example, and can be anywhere as long as the temperature of the heating object 2 is appropriately measured.

Figure 1B:
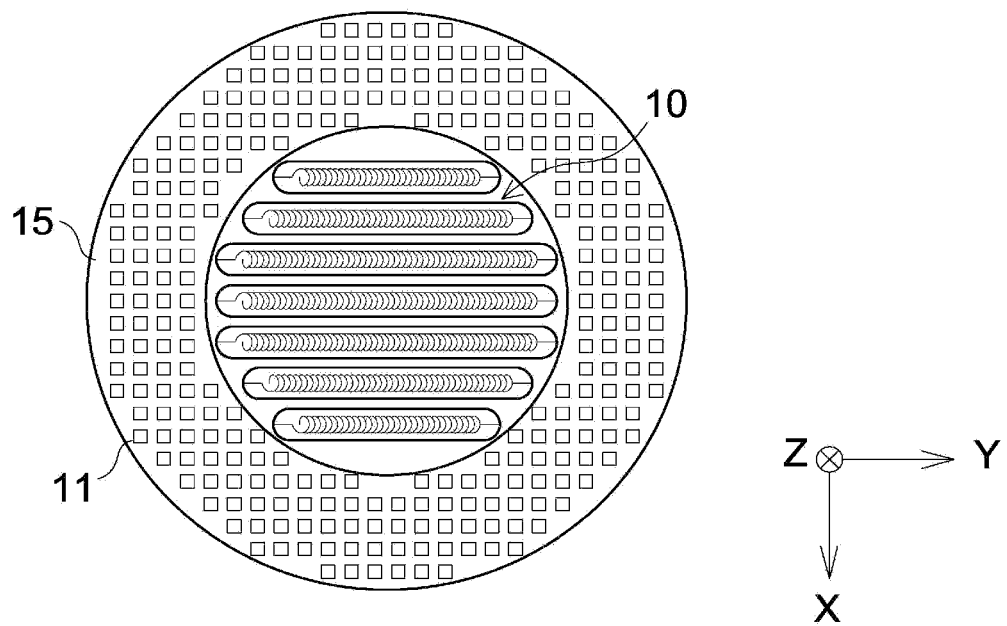
FIG. 1B is a schematic view illustrating heating lamps and LEDs of the optical heating device in FIG. 1A, viewed from the side of a heating object.

FIG. 1B is a schematic view illustrating the heating lamps 10 and the LEDs 11 of the optical heating device 1 in FIG. 1A, viewed from the side of the heating object 2. As shown in FIG. 1B, in the first embodiment, the heating lamps 10 and the LEDs 11 are arranged in the XY plane such that the light emitted from the heating lamps 10 and the LEDs 11 both irradiate the first irradiation surface 2a of the heating object 2. Also, the heating lamps each having a straight tubular shape are arranged in a circular shape on the center side, whereas the LEDs 11 are arranged on an annular-shaped substrate 15 that surrounds the heating lamps 10.

Figure 2:
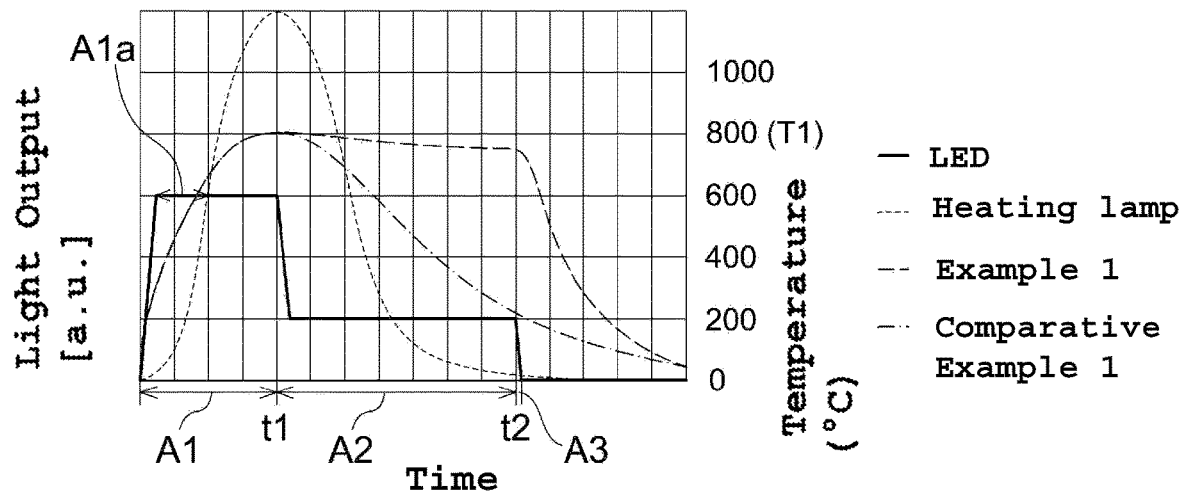
FIG. 2 is a graph illustrating the variation of light output of the heating lamps and LEDs of the first embodiment of the optical heating device, and the variation of the temperature of the heating object.

Next the heating treatment method of the heating object 2 according to the optical heating device 1 of the first embodiment is explained. FIG. 2 is a graph illustrating the variation of light output of the heating lamps 10 and LEDs 11 of the first embodiment of the optical heating device 1, and the variation of the temperature of the heating object 2. The control unit 12 of the first embodiment controls the power supplied to the heating lamps 10 and the LEDs 11 to allow the light output of the heating lamps 10 and the LEDs 11 to form the profile shown in FIG. 2.

As for the specific control, the control unit 12 of the first embodiment performs a first control for raising the temperature of the heating object 2 by irradiating it with light emitted from the heating lamps 10 and LEDs 11, a second control for decreasing the power supplied to the heating lamps 10, and a third control for decreasing the power supplied to the LEDs 11. Hereinafter, each of the control is described in detail.

First, the control performed by the control unit 12 is described along the time axis in FIG. 2. The control unit 12 starts performing the first control when the heating object 2 is supported by a supporter 14 and placed on a predetermined position. The first control corresponds to a control performed in the period A1.

Upon performing the first control by the control unit 12, the light output of the heating lamps 10 and the LEDs 11 increases to raise the temperature of the heating object 2. The LEDs 11 rapidly increases to emit the maximum output in accordance with the supplied power, whereas the heating lamps 10 gradually increases the light output in accordance with the supplied power. This control involves the period A1 in which the intensity of light emitted from the LEDs 11 is higher than that of light emitted from heating lamps 10.

The temperature of the heating object 2 rises with gradually increasing the light output of the heating lamps 10. When the temperature of the heating object 2 reaches a predetermined temperature (time t1), the control unit 12 switches to the second control that decreases the power supplied to the heating lamps 10. In other words, the first control is a control for raising the temperature of the heating object 2 to the predetermined temperature T1.

In the first embodiment, the control unit 12 is configured to receive information on the temperature of the heating object 2, for example, measured with a thermometer 13. Based on the information, the control unit 12 detects that the temperature of the heating object 2 reaches T1. It is noted that the temperature T1 is appropriately set according to the heating purpose of the heating object 2. FIG. 2 shows a case in which the temperature T1 is set to be 800° C.

The second control corresponds to a control performed in the period A2 in FIG. 2. When the control unit 12 switches from the first control to the second control at the time t1, the light output of the heating lamps 10 decreases, thus gradually decreasing the intensity of light irradiated to the heating object 2. As a result, the temperature of the heating object 2 rarely rises.

However, the temperature required for the heating treatment can be maintained when LEDs 11 irradiates the heating object 2 with light having the energy equivalent to thermal energy radiated from the heating object 2 and thermal energy released through convection and conduction. This required temperature refers to a temperature within a certain range from the predetermined temperature that indicates a reference of switching the first control to the second control, and is appropriately set according to the heating purpose.

The required temperature is, for example, within a range of 90% or more and 110% or less of the temperature T1, preferably within a range of 95% or more and 105% or less, and more preferably within a range of 98% or more and 102% or less. The heating treatment refers to, for example, chemical reaction and deposition treatment that proceed in a case in which the temperature of the heating object 2 is equal to or more than a certain temperature.

In the case that the power supplied to the LEDs 11 during the first control exceeds the thermal energy released from the heating object 2, the power supplied to the LEDs 11 may be decreased during the performance of the second control (the period A2). This control can maintain the temperature of the heating object 2 required above.

The control unit 12 may perform a feedback control of the power supplied to the LEDs 11 in accordance with the temperature information of the heating object 2, which is measured with the thermometer 13, during the performance of the second control. This feedback control allows the temperature of the heating object 2 to be regulated to maintain within a predetermined temperature range.

In addition, FIG. 2 also comparatively illustrates the temperature variation, during the second control, in a case in which the power supplied to the LEDs 11 is decreased to the extent that LEDs 11 barely emit light, concurrently with decreasing the power supplied to the heating lamps 10. As the curve for Comparative Example 1 in FIG. 2 shows, the temperature of the heating object 2 start to decrease at the time t1 at which the temperature thereof reaches the predetermined temperature in accordance with the responsiveness of the heating lamps 10. This control fails to maintain the temperature of the heating object 2 within the predetermined temperature range, resulting in the insufficient heating treatment of the heating object 2.

Upon the detection of completing the heating treatment required to the heating object 2, the control unit 12 switches to the third control that decreases the power supplied to the LEDs 11. The control unit 12, for example, has a timer function (not shown) that enables a detection that a predetermined treatment time for maintaining the temperature has elapsed since the time t1 at which the second control starts. Upon the detection, the control unit 12 may switch from the second control to the third control.

FIG. 2 shows that switching from the second control to the third control is performed at the time t2. In other words, the third control corresponds to the control performed after the time t2 (during the period A3) in FIG. 2.

In the third control, the control unit 12 controls to decrease the light output of the LEDs 11, thus rapidly decreasing the intensity of light irradiated to the heating object 2. Since the power supplied to the heating lamps 10 has already been decreased during the second control, the temperature of the heating object 2 rapidly decreases without being influenced by the slow responsiveness of the heating lamps 10.

In the optical heating device 1 according to the first embodiment, there exists a period A1a in which the light intensity of LEDs 11 is higher than that of heating lamps 10 in the performance of the first control, that is, during the temperature rise. Hence, the temperature of the heating object 2 rapidly increases just after the start of the temperature rise, thus shortening the time t1 to reach a predetermined temperature and reducing the temperature rise time.

As described in "Solution to Problem", LEDs 11 have a limited light output even when the power supplied thereto increases. Hence, the heating object 2 can be heated up to 400-500° C. at most by the optical heating device only configured with the LEDs 11.

In contrast, since the optical heating device 1 of the first embodiment is provided with the heating lamps 10, the optical heating device enables the heating object 2 to be heated up to 800-1000° C., which is difficult to achieve with the optical heating device only configured with the LEDs 11.

In the optical heating device 1 of the first embodiment, in the case of maintaining the temperature of the heating object 2 at the predetermined temperature, the power supplied to the LEDs 11 is controlled to achieve the case; in other words, the light output of the heating lamps 10 is not controlled. The LEDs 11, which have fast responsiveness to the power supplied thereto, are capable of readily fine-tuning the light output in accordance with the control of the control unit 12, thus easily maintaining the temperature of the heating object 2 with high accuracy, compared with using the heating lamps 10 to maintain the temperature thereof.

In the case of the temperature fall time, since the power supplied to the heating lamps 10 has been decreased compared with the power in the case of the temperature rise, thus the temperature of the heating object 2 lowers in accordance with the responsiveness of the LEDs 11, without being influenced by the slower responsiveness of the heating lamps 10. Therefore, the time required for the temperature fall shortens considerably.

Figure 3A:
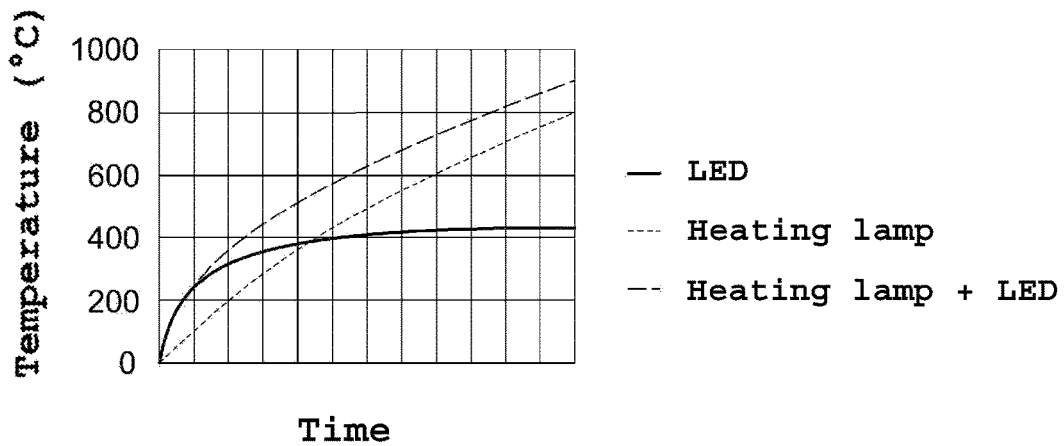
FIG. 3A is a graph illustrating the temperature variation of the heating object in the temperature rise time, in the first embodiment of the optical heating device, an optical heating device configured to be composed of only the heating lamps, and an optical heating device configured to be composed of only the LEDs.
Figure 3B:
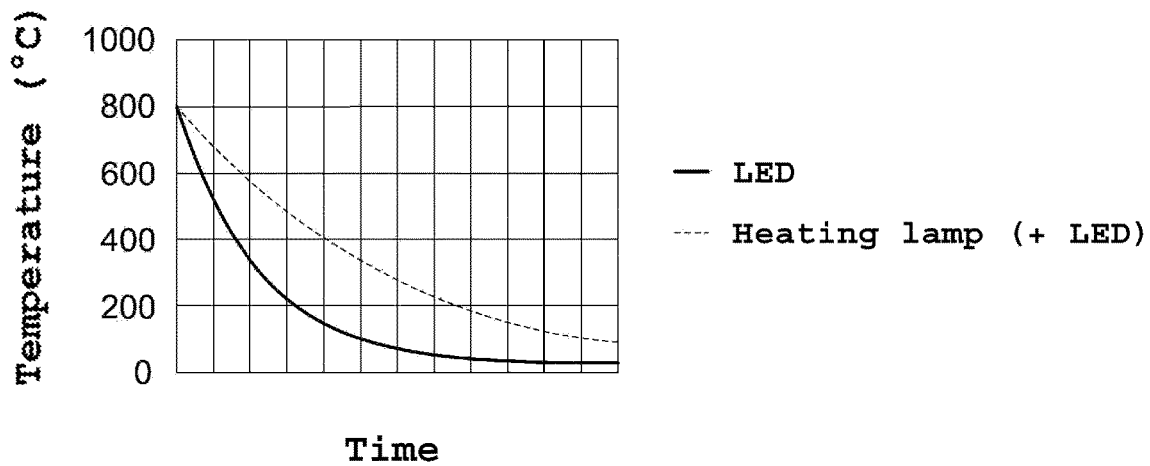
FIG. 3B is a graph illustrating the temperature variation of the heating object in the temperature fall time, in the first embodiment of the optical heating device and an optical heating device configured to be composed of only the heating lamps.

FIG. 3A is a graph illustrating the temperature variation of the heating object 2 in the temperature rise time, in the first embodiment of the optical heating device 1, an optical device configured to be composed of only the heating lamps 10, and an optical heating device 1 configured to be composed of only the LEDs 11. FIG. 3B is a graph illustrating the temperature variation of the heating object 2 in the temperature fall time, in the first embodiment of the optical heating device 1 and an optical heating device configured to be composed of only the heating lamps 10.

FIG. 3A shows the temperature variation of the heating object 2 with respect to time just after the start of supplying the power to the respective light sources in the respective optical heating devices until the temperature of the heating object 2 reaches 800° C. As described above, the optical heating device with only the LEDs 11 fails to raise the heating object 2 to 800° C.

The temperature of the heating object 2, just after the start of supplying the power, is rapidly raised to approximately 400° C. by the light emitted from LEDs 11. After this, the temperature reaches 800° C. with gradually increasing the light output of the heating lamps 10. As shown in FIG. 3A, the LEDs 11 are capable of rapidly raising the temperature of the heating object 2 at the start of the temperature rise, thus shortening the time required for the temperature rise compared with the optical heating device constituted with only the heating lamps 10.

FIG. 3B shows the temperature variation with respect to time when the power supplied to the light source stops in a state in which the temperature of the heating object 2 is 800° C. LEDs 11, which have fast responsiveness, rapidly stops light irradiated to the heating object 2 due to the stop of supplying power. Then the heating object 2, to which the energy is no longer supplied, lowers its temperature by heat radiation.

In contrast, the heating lamps 10, which have slow responsiveness, does not stop irradiating the heating object 2 with light; the light output gradually decreases. Hence, the energy, even slightly, is supplied to the heating object 2 from light emitted from the heating lamps 10, thereby taking more time to lower the temperature, lengthening the time to lower to the half of the temperature. In the case of the configuration in which the heating lamps 10 and LEDs 11 are combined, when the power supplied to both of the light sources simultaneously decreases to lower the temperature, the temperature variation indicates nearly similar to that of the optical heating device constituted by only the heating lamps 10 because the temperature variation is highly influenced by the slow responsiveness of the heating lamps 10.

As described above, as shown in FIG. 3A and FIG. 3B, the control according to the first embodiment, in which the power is supplied to the heating lamps 10 and LEDs 11 to raise the temperature in the temperature rise time and the power supplied to the heating lamps 10 lowers prior to lowering the power supplied to the LEDs 11 to lower the temperature in the temperature fall time, enables the temperature rise and fall time to shorten while sufficiently ensuring the time of maintaining the temperature in the predetermined temperature range for heating the heating object 2, thus shortening the time required for the heating treatment.

Second Embodiment

The configuration of a second embodiment of an optical heating device 1 of the present invention is mainly described in the points that differ from those of the first embodiment.

Figure 4A:
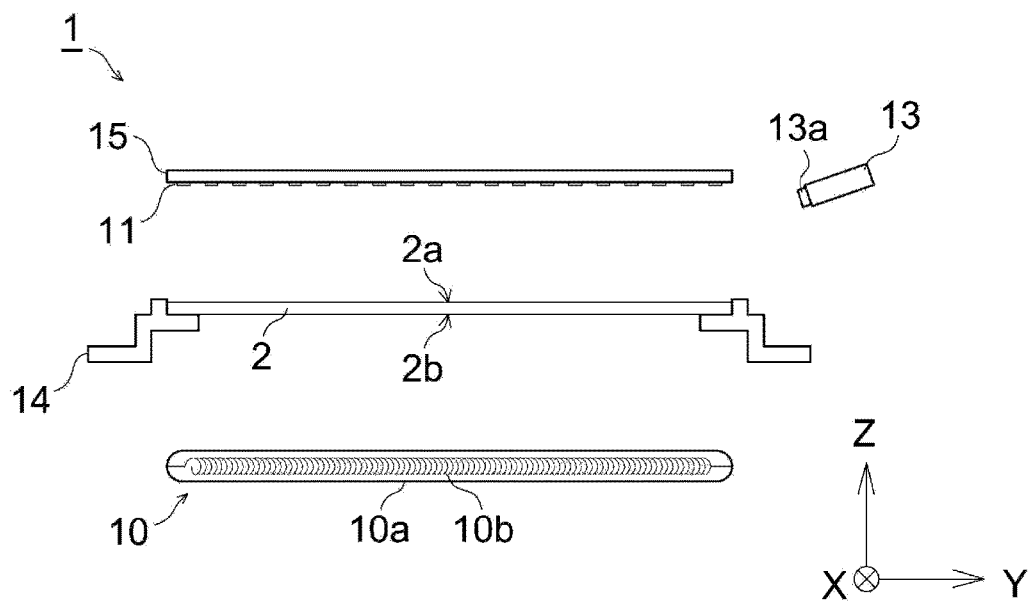
FIG. 4A is a schematic cross-sectional view illustrating a second embodiment of an optical heating device.
Figure 4B:
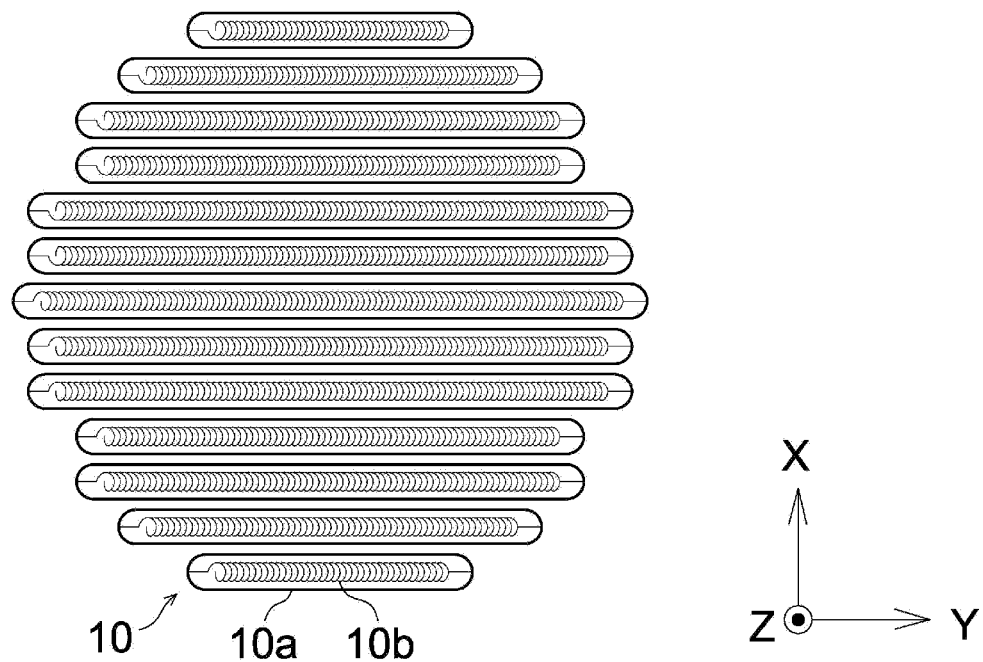
FIG. 4B is a schematic view illustrating heating lamps of the optical heating device in FIG. 4A, viewed from the side of the heating object.
Figure 4C:
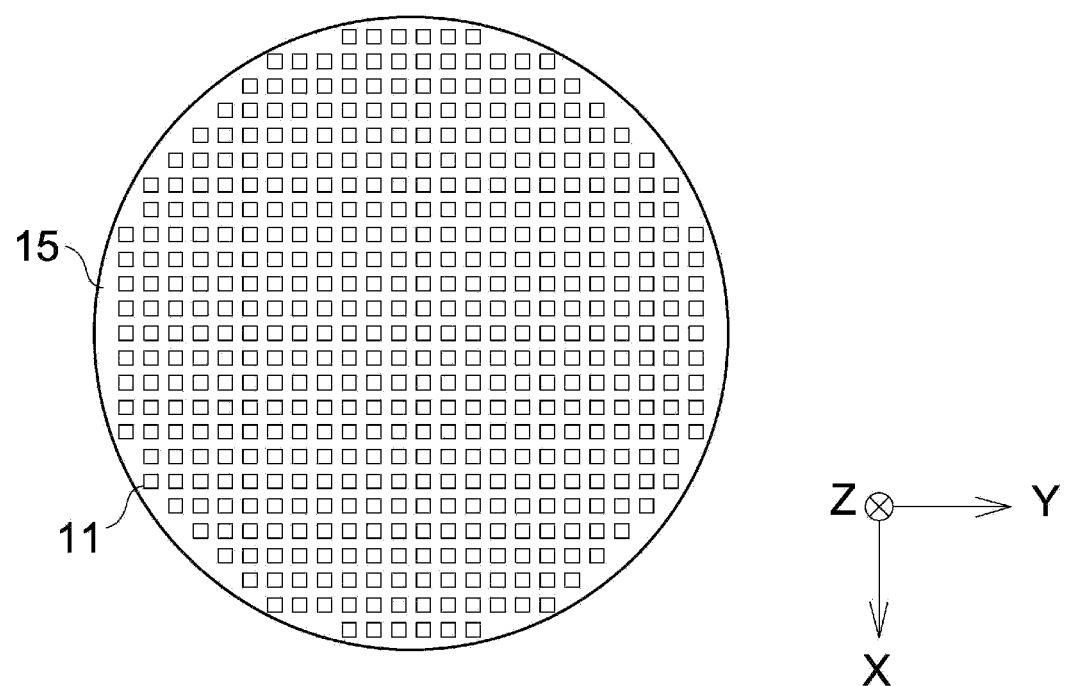
FIG. 4C is a schematic view illustrating LEDs of the optical heating device in FIG. 4A, viewed from the side of the heating object.

FIG. 4A is a schematic cross-sectional view illustrating the optical heating device 1 of the second embodiment. FIG. 4B is a schematic view illustrating heating lamps 10 of the optical heating device 1 in FIG. 4A, viewed from the side of a heating object 2. FIG. 4C is a schematic view illustrating LEDs 11 of the optical heating device 1 in FIG. 4A, viewed from the side of the heating object 2. As shown in FIGS. 4A to 4C, the heating lamps 10, each of which is a straight tube shape, are arranged to form a circle shape, the heating lamps 10 being in the side of the second irradiation surface 2b of the heating object 2, whereas the LEDs 11 are arranged on a circle shape board 15, the LEDs 11 being in the side of the first irradiation surface 2a of the heating object 2.

Since the heating lamps 10 and the LEDs 11 are disposed separately at the side of the first irradiation surface 2a and the side of the second irradiation surface 2b with respect to the heating object 2, the heating object 2 is irradiated with the respective light source (10a, 10b) disposed in the side of its irradiation surface (2a, 2b). In the second embodiment, the light sources are disposed in both of the side of the first irradiation surface 2a and the side of the second irradiation surface 2b, thereby increasing the amount of light irradiated to the heating object 2 compared with that in the first embodiment. Therefore, the second embodiment enables the temperature of the heating object 2 to rise and fall more rapidly than that in the first embodiment.

Moreover, since both of the first irradiation surface 2a and the second irradiation surface 2b of the heating object 2 are irradiated with light, the temperature variation between each surface (2a, 2b) is smaller than that in the first embodiment, thereby reducing an occurrence of the damage such as crack or break of the heating object 2 caused by the thermal expansion of the heating object 2 or the like.

The above configuration allows the light emitted from the heating lamps 10 to be blocked by the heating object 2 and prevents the light from directly irradiating the LEDs 11. Hence the LEDs 11 is not absorbed by the light emitted from the heating lamps 10 to raise the temperature thereof, thus reducing occurrence of turning off or damaging the LEDs 11.

Third Embodiment

The configuration of the third embodiment of the optical heating device 1 of the present invention is mainly described in the points that differ from those of the first embodiment and the second embodiment.

The third embodiment has the same arrangement of the heating lamps 10 as that of the second embodiment; however it has a different shape of the board 15 on which the LEDs 10 are arranged from that of the second embodiment.

Figure 5A:
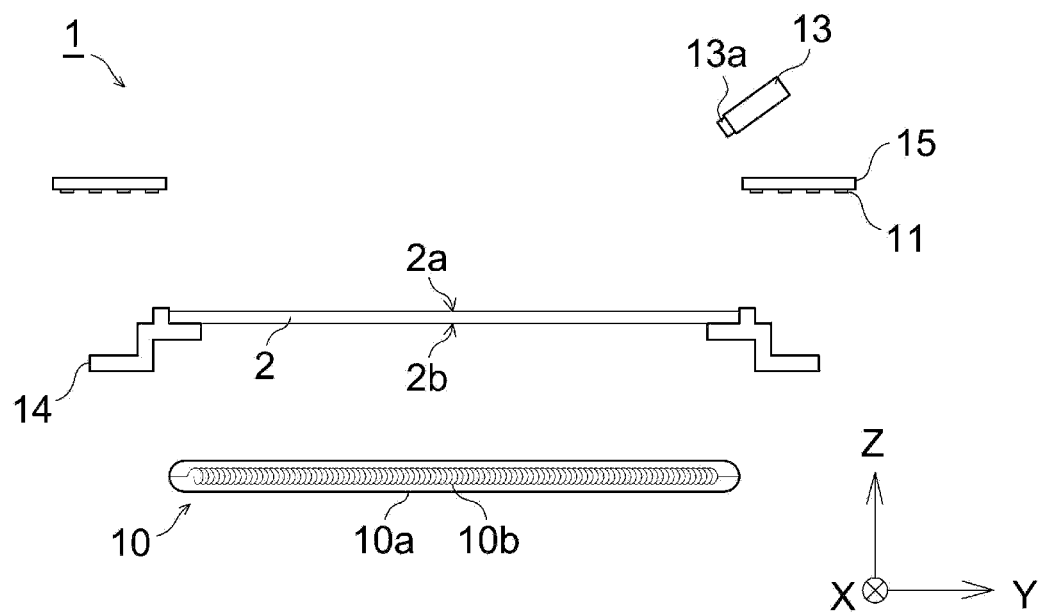
FIG. 5A is a schematic cross-sectional view illustrating a third embodiment of an optical heating device.
Figure 5B:
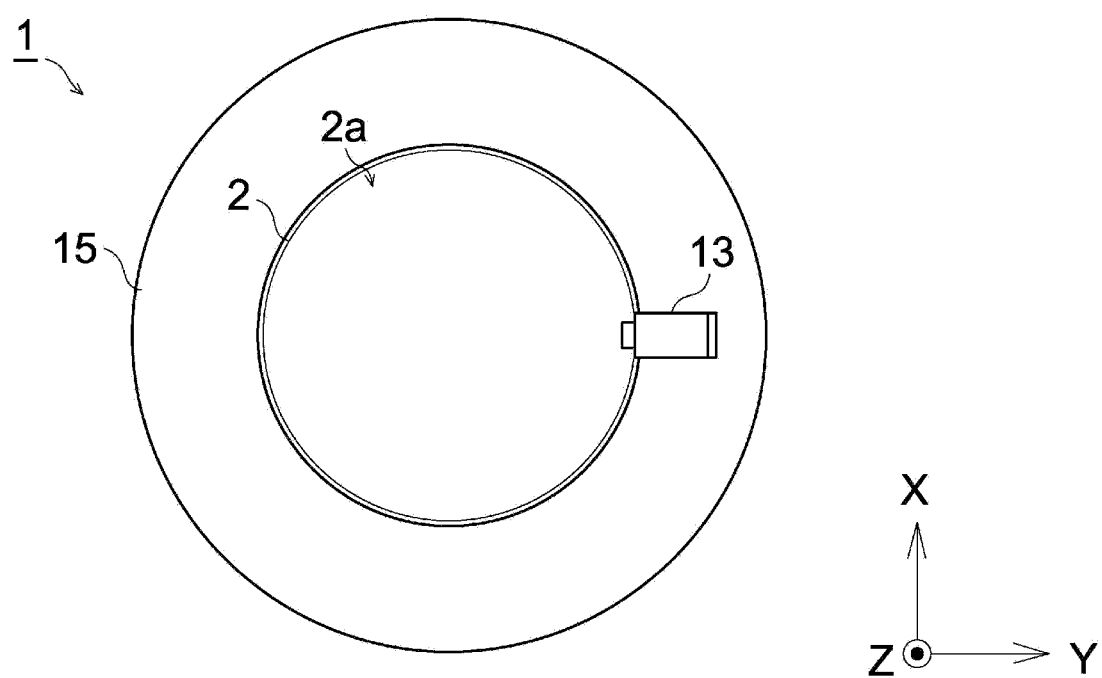
FIG. 5B is a schematic plan view illustrating the optical heating device in FIG. 5A.

FIG. 5A is a schematic cross-sectional view illustrating a third embodiment of an optical heating device 1. FIG. 5B is a schematic plan view illustrating the optical heating device 1 in FIG. 5A. As shown in FIGS. 5A and 5B, the LEDs 11 are arranged on the annular shape board 15 in the side of the first irradiation surface 2a of the heating object 2, and also arranged further outside than the heating object 2 when the optical heating device 1 is viewed in the Z direction.

The heating lamps 10, which emit high intensity of light, raise the temperature of the heating object 2 to a high temperature by irradiating the center of the heating object 2 with light. The LEDs 11, which have fast responsiveness, raise the temperature of the periphery of the heating object 2 by irradiating the periphery thereof with light, thus supplying the energy equivalent to the thermal energy released from the periphery of the heating object 2.

Fourth Embodiment

The configuration of the fourth embodiment of the optical heating device 1 of the present invention is mainly described in the points that differ from those of the first embodiment to the third embodiment.

In the optical heating device 1 of the fourth embodiment, a supporter 14 that is provided in the optical heating device 1 is configured to be rotatable on the XY plane of the heating object 2. Rotating the heating object 2 on the XY plane with the supporter 14 enables the heating object 2 to be uniformly irradiated with the light emitted from the heating lamps 10 and the light emitted from the LEDs 11 in its circumferential direction, thereby suppressing the unevenness of the heating. The following fourth embodiment to the sixth embodiment are the configurations in which the supporter 14 rotates the heating object 2 on the XY plane.

Figure 6A:
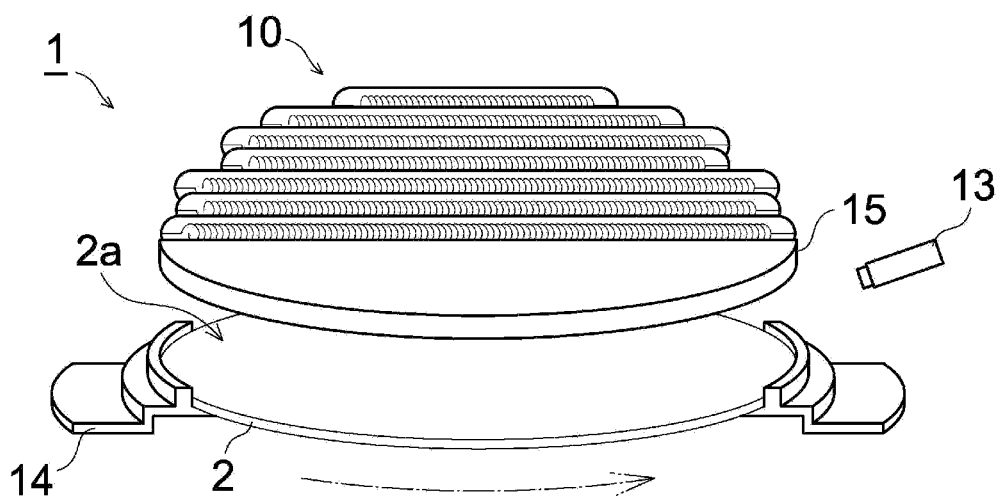
FIG. 6A is a schematic perspective view illustrating an optical heating device of a fourth embodiment.
Figure 6B:
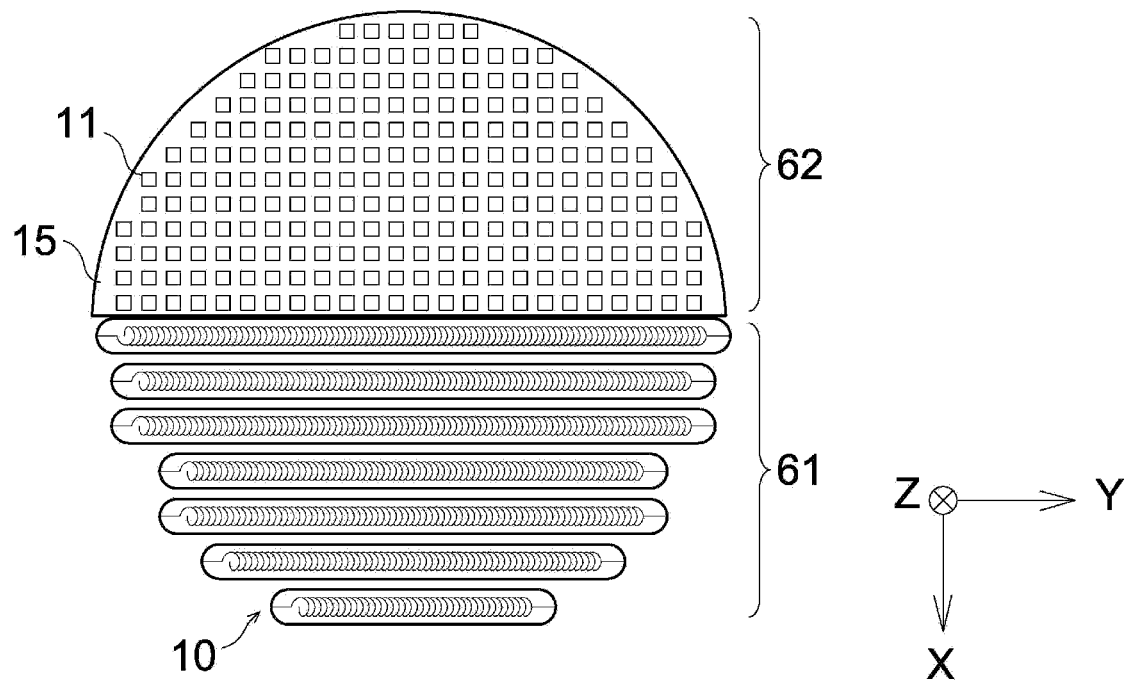
FIG. 6B is a schematic view illustrating heating lamps and LEDs of the optical heating device of the fourth embodiment, viewed from the side of the heating object.

FIG. 6A is a schematic perspective view illustrating an optical heating device 1 of a fourth embodiment. FIG. 6B is a schematic view illustrating heating lamps 10 and LEDs 11 of the optical heating device 1 of the fourth embodiment, viewed from the side of the heating object 2. As shown in FIG. 6B, the heating lamps 10, each of which is a straight tube shape, are disposed in the first area 61 and the LEDs 11 are disposed in the second area 62, these areas corresponding to the area of the heating object 2 being bisected with a straight line passing through the center of the heating object 2.

The above configuration, when the heating object 2 rotates, allows the entire heating object 2 to be irradiated with light emitted from both of the heating lamps 10 and the LEDs 11. Furthermore, the configuration improves the uniformity of light that is concentrically irradiated to the heating object 2.

Fifth Embodiment

The configuration of the fifth embodiment of the optical heating device 1 of the present invention is mainly described in the points that differ from those of the first embodiment to the fourth embodiment.

Figure 7:
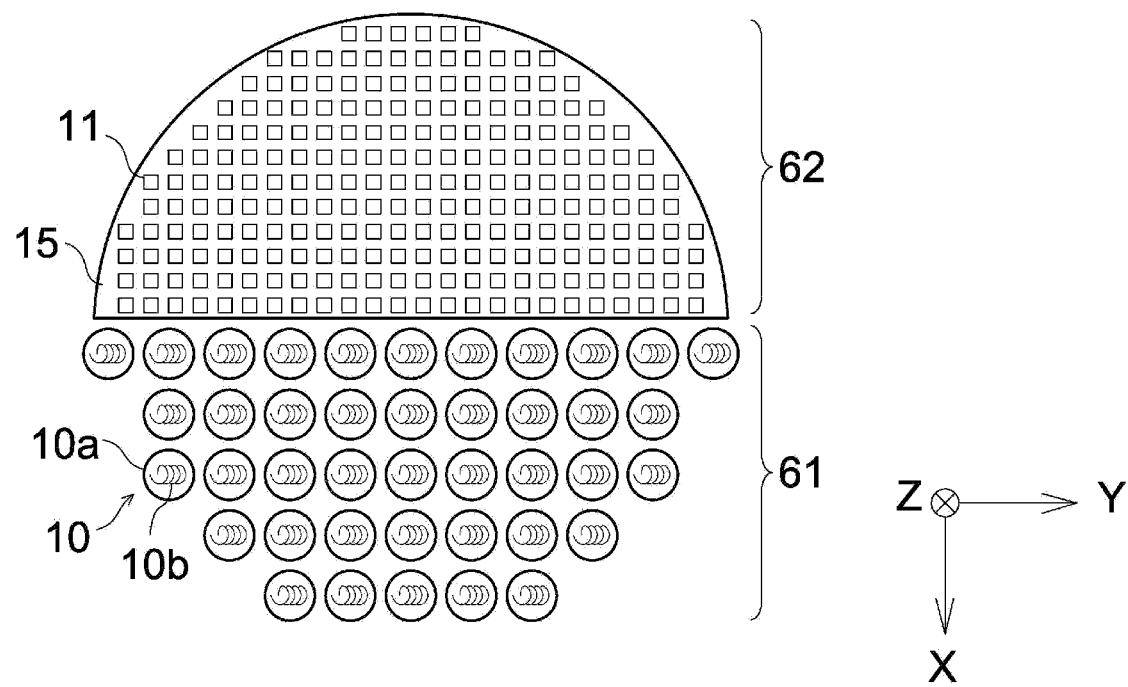
FIG. 7 is a schematic view illustrating heating lamps and LEDs of an optical heating device of a fifth embodiment, viewed from the side of the heating object.

FIG. 7 is a schematic view illustrating heating lamps 10 and LEDs 11 of an optical heating device 1 of a fifth embodiment, viewed from the side of the heating object 2. As shown in FIG. 7, the heating lamps 10, each of which is a light bulb shape, are disposed in the first area 61 and the LEDs 11 are disposed in the second area 62, these areas corresponding to the area the heating object 2 being bisected with a straight line passing through the center of the heating object 2.

In the fifth embodiment, which is similar to the fourth embodiment, rotating the heating object 2 with the supporter 14 enables the heating object 2 to be entirely irradiated with the light emitted from both of the heating lamps 10 and the LEDs 11. Furthermore, the configuration improves the uniformity of light that is concentrically irradiated to the heating object 2.

Sixth Embodiment

The configuration of the sixth embodiment of the optical heating device 1 of the present invention is mainly described in the points that differ from those of the first embodiment to the fifth embodiment.

Figure 8:
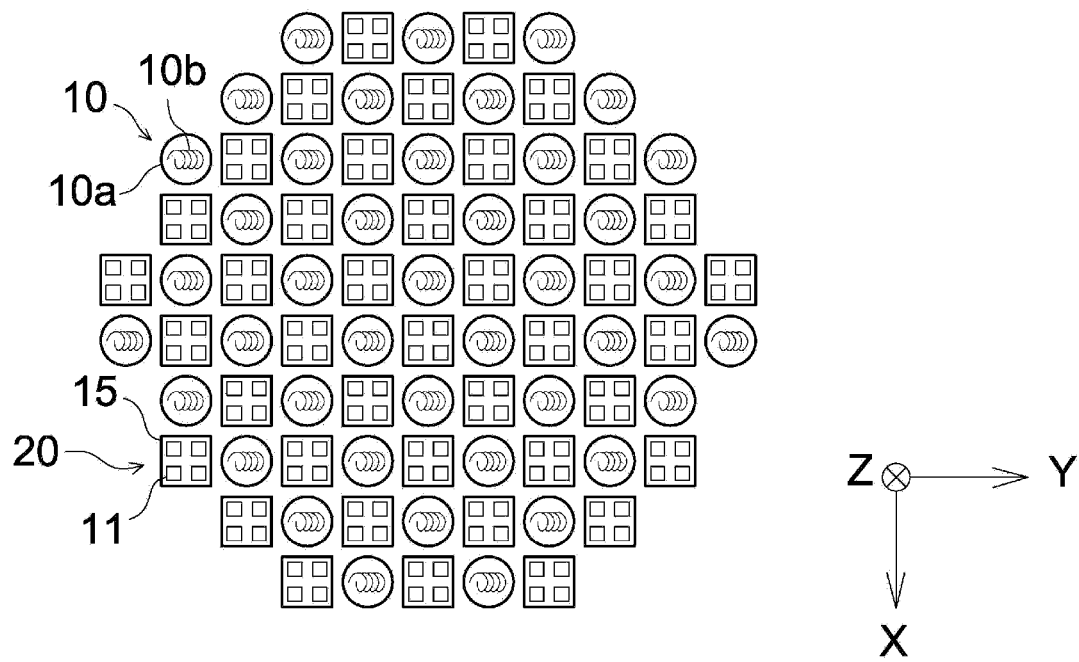
FIG. 8 is a schematic view illustrating heating lamps and LEDs of an optical heating device of a sixth embodiment, viewed from the side of the heating object.

FIG. 8 is a schematic view illustrating the heating lamps 10 and the LEDs 11 of the optical heating device 1 of the sixth embodiment, viewed from the side of the heating object 2. As shown in FIG. 8, LED units 20 are arranged alternately in the X direction and the Y direction, each of the LED units 20 being composed of the heating lamps 10, each having a light bulb shape, and a plurality of the LEDs 11.

In the sixth embodiment, which is similar to the fourth embodiment and the fifth embodiment, rotating the heating object 2 with the supporter 14 enables the heating object 2 to be entirely irradiated with the light emitted from both of the heating lamps 10 and the LEDs 11. Furthermore, the configuration improves the uniformity of light that is concentrically irradiated to the heating object 2.

In the optical device 1 of the sixth embodiment, a certain position of the irradiation surface (2a, 2b) of the heating object 2 is alternately irradiated with the light emitted from the heating lamps 10 and the light emitted from the LEDs 11 in a short period of time, thereby improving the uniformity of light irradiated to the heating object 2.

Another Embodiment

Hereinafter, another embodiment is described.

Figure 9A:
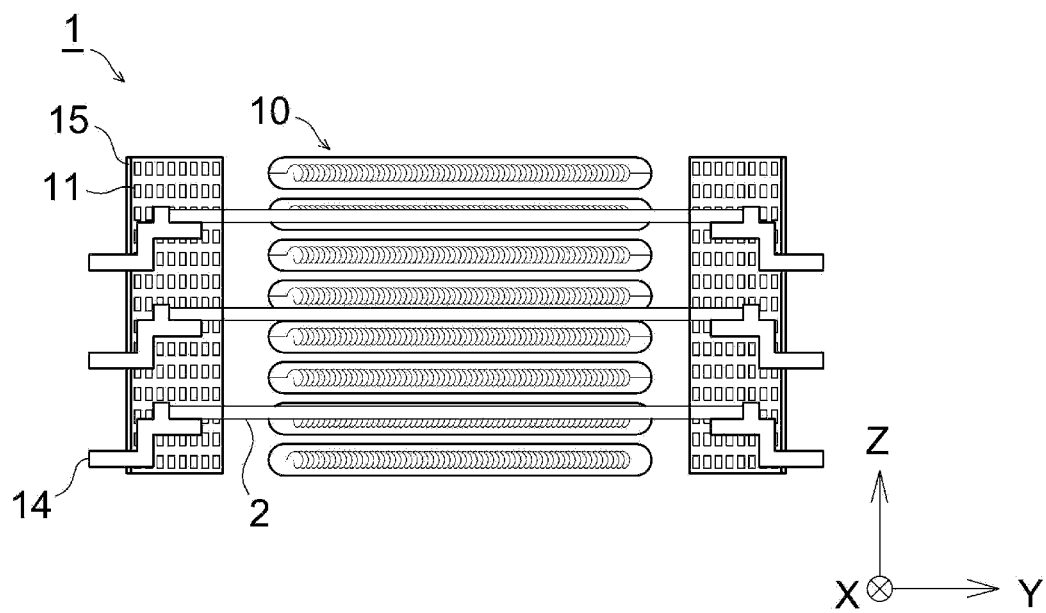
FIG. 9A is a schematic side view illustrating another embodiment of an optical heating device.
Figure 9B:
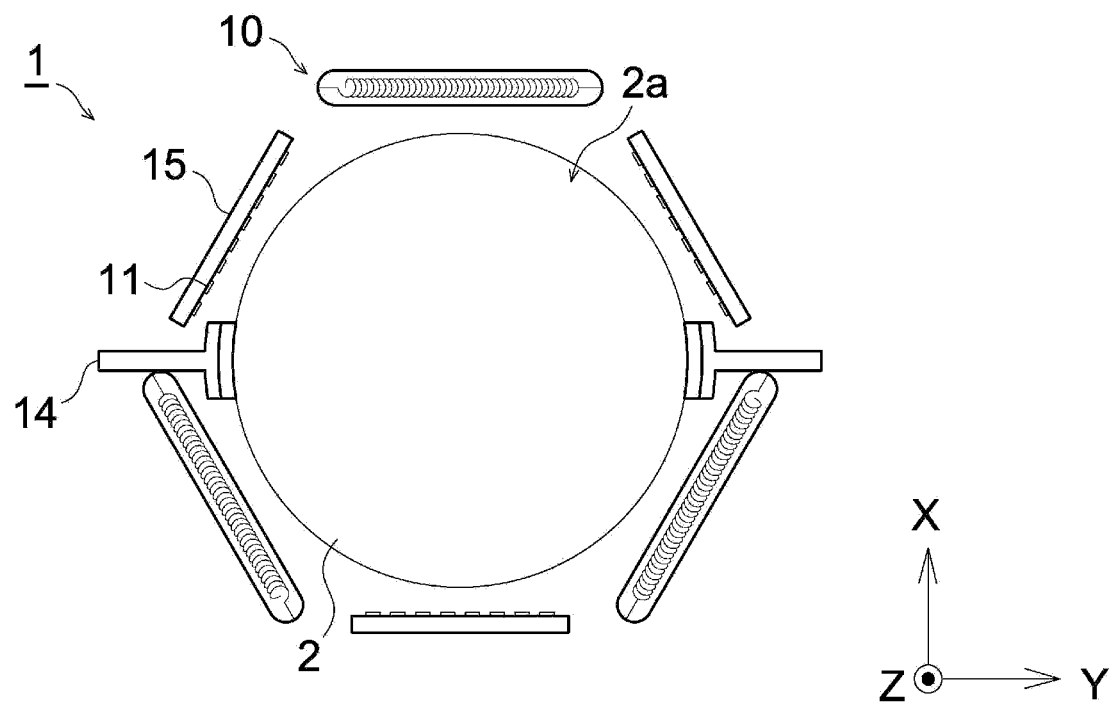
FIG. 9B is a schematic plan view illustrating the optical heating device in FIG. 9A.
Figure 10A:
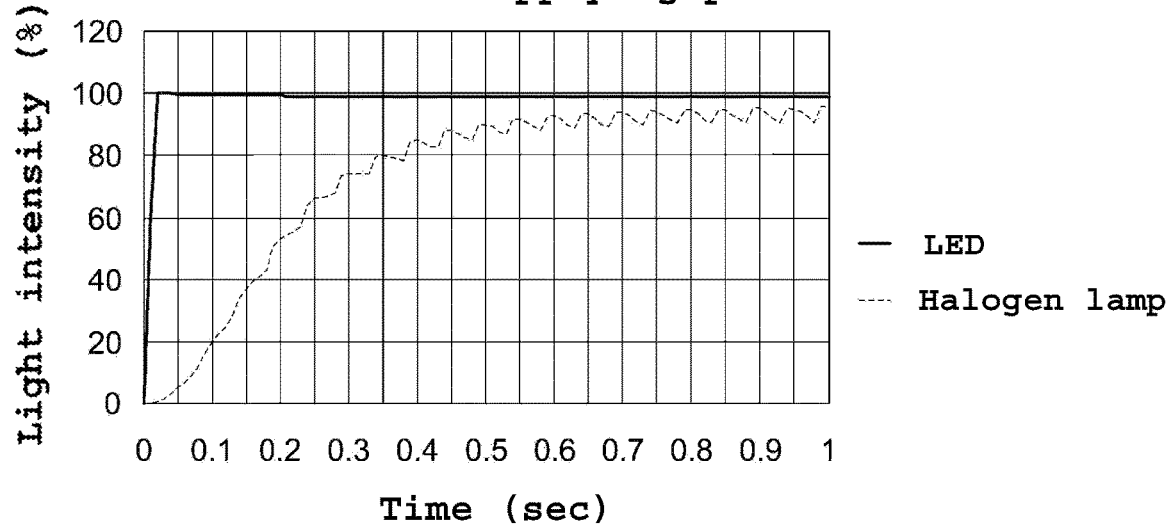
FIG. 10A is a graph illustrating the variation of amount of light emitted from halogen lamps and LEDs at the start of supplying the power.
Figure 10B:
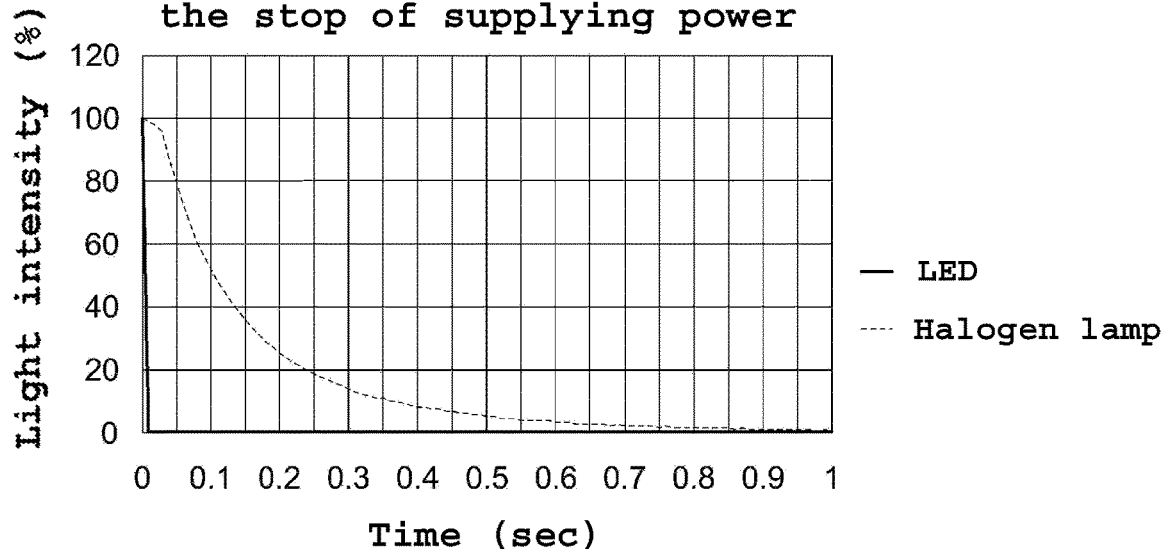
FIG. 10B is a graph illustrating the variation of amount of light emitted from halogen lamps and LEDs at the stop of supplying the power.

<1> FIG. 9A is a schematic side view illustrating another embodiment of an optical heating device 1. FIG. 9B is a schematic plan view illustrating the optical heating device in FIG. 9A. As shown in FIGS. 9A and 9B, a plurality of the heating objects 2 may be arranged in multiple stages along the Z direction. The heating lamps 10 and the LEDs 11 may be arranged in the side of the side face of the heating objects 2.

The above configuration enables the heating treatment of a plurality of the heating objects 2 at one time, thus considerably shortening the time for the heating treatment process. In addition, when the LEDs 11, the wavelength of whose emitted light is selectable, are appropriately selected such that their light is likely to transmit through the heating object 2, the temperature of the heating object 2 can rise or fall with a smaller temperature variation between the center side and the edge side of the heating object 2.

<2> The optical heating device 1 may be provided with a piece of glass that is transmissive to infrared light having the absorption wavelength band of the heating object 2, the piece of glass entirely or partially being disposed between the heating object 2 and each of the light source (10, 11). The configuration of disposing the piece of glass between the heating object 2 and each of the light source (10, 11) prevents dust or dirt or the like from attaching to the heating surface of the heating object 2.

<3> The configuration of the optical heating device 1 described above is a merely example, and the present invention is not limited to each configuration shown. The control of the optical heating method or the optical heating device 1 of the present invention, for example, can be applied to the optical heating device whose configuration is described in the patent document 1.

<4> The heating object 2 of the present invention can be anything as long as it is an object to be heated by the light emitted from the heating lamp 10 and the LED 11.

REFERENCE SIGNS LIST

1 optical heating device
2 heating object
2a first irradiation surface
2b second irradiation surface
10 heating lamp
10a tube body
10b filament
11 LED
12 control unit
13 thermometer
13a light-receiving part
14 supporter
15 substrate
20 LED unit
61 first area
62 second area
t1, t2 time
A1, A1a, A2, A3 period
T1 temperature

The invention claimed is:

1. A heating treatment method of the present invention comprising:
   a step (A) of supplying power to both a heating lamp and an LED at the same time until the heating object reaches towards a first predetermined temperature, and irradiating a heating object with light emitted from the heating lamp and light emitted from the LED to raise a heating object temperature as being defined as a temperature of the heating object;
   a step (B) of decreasing the power supplied to the heating lamp after performing the step (A) to reduce the heating object temperature ultimately below the first predetermined temperature; and
   a step (C) of lowering the heating object temperature by decreasing the power supplied to the LED after performing the step (B).

2. The heating treatment method according to claim 1, wherein the step (B) further comprises a step of maintaining the heating object temperature within a predetermined temperature range.

3. The heating treatment method according to claim 2, wherein the step (B) further comprises step of maintaining the power supplied to the LED, the step (B) being performed for a predetermined time before a start of the step (C).

4. The heating treatment method according to claim 3, wherein the step (A) includes a period in which the intensity of light emitted from the LED is higher than that of light emitted from the heating lamp, the step (A) being performed from a start of a temperature rise for a predetermined time.

5. The heating treatment method according to claim 2, wherein the step (A) includes a period in which the intensity of light emitted from the LED is higher than that of light emitted from the heating lamp, the step (A) being performed from a start of a temperature rise for a predetermined time.

6. The heating treatment method according to claim 1, wherein the step (B) further comprises step of maintaining the power supplied to the LED, the step (B) being performed for a predetermined time before the start of the step (C).

7. The heating treatment method according to claim 6, wherein the step (A) includes a period in which the intensity of light emitted from the LED is higher than that of light emitted from the heating lamp, the step (A) being performed from a start of a temperature rise for a predetermined time.

8. The heating treatment method according to claim 1, wherein the step (A) includes a period in which the intensity of light emitted from the LED is higher than that of light emitted from the heating lamp, the step (A) being performed from the start of a temperature rise to a predetermined time.

9. An optical heating device comprising:
a heating lamp;
an LED;
a control unit for controlling power supplied to the heating lamp and the LED for varying a heating object temperature as being defined as a temperature of the heating object; and
a supporter for supporting a heating object;
wherein the control unit performs a first control that supplies the power to both the heating lamp and the LED at the same time until the heating object reaches towards a first predetermined temperature, a second control that decreases the power supplied to the heating lamp after performing the first control to reduce the heating object temperature ultimately below the first predetermined temperature, and a third control that decreases the power supplied to the LED after performing the second control.

10. The optical heating device according to claim 9, wherein the control unit controls to maintain the power supplied to the LED in the second control, the second control being performed for a predetermined time before a start of the third control.

11. The optical heating device according to claim 10, wherein the control unit controls to include a period in which the intensity of light emitted from the LED is higher than that of light emitted from the heating lamp in the first control, the first control being performed from a start of a temperature rise for a predetermined time.

12. The optical heating device according to claim 11, further comprising a thermometer for measuring the heating object temperature,
wherein the control unit switches from the first control to the second control by detecting that the heating object temperature reaches the first predetermined temperature.

13. The optical heating device according to claim 10, further comprising a thermometer for measuring the heating object temperature,
wherein the control unit switches from the first control to the second control by detecting that the heating object temperature reaches the first predetermined temperature.

14. The optical heating device according to claim 9, wherein the control unit controls to include a period in which the intensity of light emitted from the LED is higher than that of light emitted from the heating lamp in the first control, the first control being performed from a start of a temperature rise for a predetermined time.

15. The optical heating device according to claim 14, further comprising a thermometer for measuring the heating object temperature,
wherein the control unit switches from the first control to the second control by detecting that the heating object temperature reaches the first predetermined temperature.

16. The optical heating device according to claim 9, further comprising a thermometer for measuring the heating object temperature,
wherein the control unit switches from the first control to the second control by detecting that the heating object temperature reaches the first predetermined temperature.

* * * * *